United States Patent
Wasilousky et al.

(10) Patent No.: US 11,662,612 B2
(45) Date of Patent: May 30, 2023

(54) ACOUSTO-OPTIC MODULATOR SYSTEM AND DEVICE WITH CONNECTIONS AND RELATED METHODS

(71) Applicant: EAGLE TECHNOLOGY, LLC, Melbourne, FL (US)

(72) Inventors: Peter A. Wasilousky, Indialantic, FL (US); Christopher A. Corey, Palm Bay, FL (US); Carrigan L. Braun, West Melbourne, FL (US); Michael R. Lange, Melbourne, FL (US); Catheryn D. Logan, Melbourne, FL (US); Randall K. Morse, Palm Bay, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 777 days.

(21) Appl. No.: 16/690,522

(22) Filed: Nov. 21, 2019

(65) Prior Publication Data

US 2021/0157180 A1 May 27, 2021

(51) Int. Cl.
*G02F 1/11* (2006.01)
*G06N 10/00* (2022.01)
(Continued)

(52) U.S. Cl.
CPC .......... *G02F 1/113* (2013.01); *G02F 1/0102* (2013.01); *G02F 1/11* (2013.01); *G02F 1/33* (2013.01);
(Continued)

(58) Field of Classification Search
CPC .......... H05K 2201/09227; H05K 2201/10121; H05K 1/11; H05K 1/115; G06N 10/00;
(Continued)

(56) References Cited

U.S. PATENT DOCUMENTS 4,256,362 A 3/1981 Bardos
5,477,087 A * 12/1995 Kawakita ............... H01L 24/12
257/737

(Continued)

FOREIGN PATENT DOCUMENTS

EP 0988575 3/2000
JP H02248923 A 10/1990

OTHER PUBLICATIONS

"1976 IEEE Ultrasonics Symposium Abstracts" by LCL Panametrics: IEEE Transactions on Sonics and Ultrasonices; https://ieeexplore.ieee.org/iel5/10326/32824/01538998.pdf; Mar. ?1977: pp. 32.

(Continued)

*Primary Examiner* — Peter Dungba Vo
*Assistant Examiner* — Azm A Parvez
(74) *Attorney, Agent, or Firm* — Allen, Dyer, Doppelt + Gilchrist, P.A.

(57) ABSTRACT

An acousto-optic system may include a laser source, and an AOM coupled to the laser source and having an acousto-optic medium and transducer electrodes carried by the medium. The acousto-optic system may also include an interface board with a dielectric layer and signal contacts carried by the dielectric layer, and connections coupling respective signal contacts with respective transducer electrodes. Each connection may include a dielectric protrusion extending from the AOM, and an electrically conductive layer on the dielectric protrusion for coupling a respective transducer electrode to a respective signal contact.

17 Claims, 14 Drawing Sheets

(51) Int. Cl.
*G02F 1/01* (2006.01)
*G02F 1/33* (2006.01)
*H01S 5/00* (2006.01)
*H05K 1/11* (2006.01)
*H05K 3/40* (2006.01)

(52) U.S. Cl.
CPC .............. *G02F 1/332* (2013.01); *G06N 10/00* (2019.01); *H01S 5/005* (2013.01); *H01S 5/0085* (2013.01); *H05K 1/11* (2013.01); *H05K 1/115* (2013.01); *H05K 3/4038* (2013.01); *H05K 2201/09227* (2013.01); *H05K 2201/10121* (2013.01)

(58) Field of Classification Search
CPC .......... G02F 1/113; G02F 1/0102; G02F 1/11; G02F 1/33; G02F 1/332
USPC ........................................................ 359/107
See application file for complete search history.

(56) References Cited

U.S. PATENT DOCUMENTS

| | | |
|---|---|---|
| 5,923,460 A | 7/1999 | Stewart et al. |
| 6,320,989 B1 | 11/2001 | Montgomery et al. |
| 6,487,324 B2 | 11/2002 | Montgomery et al. |
| 6,538,690 B1 | 3/2003 | Montgomery et al. |
| 6,765,709 B1 | 7/2004 | Montgomery et al. |
| 6,870,658 B2 | 3/2005 | Wasilousky et al. |
| 6,891,266 B2 | 5/2005 | Kinayman et al. |
| 7,538,929 B2 | 5/2009 | Wasilousky |
| 8,981,568 B2 | 3/2015 | Rathburn |
| 2003/0133680 A1* | 7/2003 | Yokoyama ............... G02B 6/13 385/129 |
| 2008/0247027 A1 | 10/2008 | Wasilousky |
| 2018/0203325 A1* | 7/2018 | Wasilousky ............ G02F 1/292 |
| 2018/0299745 A1* | 10/2018 | Morse ....................... G02F 1/33 |

OTHER PUBLICATIONS

U.S. Appl. No. 16/458,457, filed Jul. 1, 2019; Lange et al.
Wasilousky et al. U.S. Appl. No. 16/691,709, filed Nov. 22, 2019.

* cited by examiner

ACOUSTO-OPTIC MODULATOR SYSTEM AND DEVICE WITH CONNECTIONS AND RELATED METHODS

TECHNICAL FIELD

The present invention relates to the field of optical devices, and, more particularly, to AOMs for lasers and related methods.

BACKGROUND

Acousto-optic modulators (AOMs), sometimes referred to as Bragg cells, diffract and shift light using sound waves at radio frequency. These devices are often used for Q-switching, signal modulation in telecommunications systems, laser scanning and beam intensity control, frequency shifting, and wavelength filtering in spectroscopy systems. Many other applications lend themselves to using acousto-optic devices.

In such acousto-optic devices, a piezoelectric transducer, sometimes also referred to as a radio frequency (RF) transducer, is secured to an acousto-optic bulk medium as a transparent optical material, for example, fused silica, quartz or similar glass material. An electric RF signal oscillates and drives the transducer to vibrate and create sound waves within the transparent medium, which effect the properties of an optical field in the medium via the photo elastic effect, in which a modulating strain field of an ultrasonic wave is coupled to an index of refraction for the acousto-optic bulk medium. As a result, the refractive index change in amplitude is proportional to that of sound.

The index of refraction is changed by moving periodic planes of expansion and compression in the acousto-optic bulk material. Incoming light scatters because of the resulting periodic index modulation and interference, similar to Bragg diffraction.

AOMs are preferred in many applications because they are faster than tilt-able mirrors and other mechanical devices. The time it takes for the acousto-optic modulator to shift an exiting optical beam is limited to the transit time of the sound wave. The AOMs are often used in Q-switches where a laser produces a pulsed output beam at high peak power, typically in the Kilowatt range. This output could be higher than lasers operating a continuous wave (CW) or constant output mode.

Examples of acousto-optic modulator devices and similar acousto-optic systems are disclosed in commonly assigned U.S. Pat. Nos. 4,256,362; 5,923,460; 6,320,989; 6,487,324; 6,538,690; 6,765,709; and 6,870,658, the disclosures of which are hereby incorporated by reference in their entireties.

One approach which may be used to help enhance the diffracted beam pointing stability of acousto-optic devices is set forth in U.S. Pat. No. 7,538,929 to Wasilousky, which is assigned to the Harris Corporation and is hereby incorporated herein in its entirety by reference. Wasilousky discloses an acousto-optic modulator, which includes an acousto-optic bulk medium and transducer attached to the acousto-optic bulk medium and formed as a linear array of electrodes.

SUMMARY

Generally, an acousto-optic system may include a laser source, an AOM coupled to the laser source and comprising an acousto-optic medium and a plurality of transducer electrodes carried thereby, and an interface board. The interface board may include a dielectric layer and a plurality of signal contacts carried thereby. The acoustic-optic system may also comprise a plurality of connections coupling respective signal contacts with respective transducer electrodes. Each connection may include a dielectric protrusion extending from the AOM, and an electrically conductive layer on the dielectric protrusion for coupling a respective transducer electrode to a respective signal contact.

In particular, each connection may comprise a pair of spaced apart alignment protrusions extending from the interface board with the dielectric protrusion therebetween. Each transducer electrode may extend beneath a respective dielectric protrusion. Each electrically conductive layer may comprise an electrically conductive strap having opposing ends coupled to the respective transducer electrode.

In some embodiments, the respective dielectric protrusions for the plurality of connections may be contiguous with one another and define an elongate strip. The interface board may comprise a plurality of vertically extending signal vias coupled respectively to the plurality of signal contacts. Also, the interface board may comprise a plurality of reference voltage shield vias and respective reference voltage traces coupled thereto. The acousto-optic system may also include modulator drive circuitry coupled to the plurality of signal contacts. For example, the acousto-optic medium may comprise at least one of fused silica and quartz. The acousto-optic system may comprise an atom trap downstream from the AOM so that the system defines a quantum computer.

Another aspect is directed to an acousto-optic device comprising an AOM comprising an acousto-optic medium and a plurality of transducer electrodes carried thereby, and an interface board comprising a dielectric layer and a plurality of signal contacts carried thereby. The acousto-optic device may include a plurality of connections coupling respective signal contacts with respective transducer electrodes. Each connection may comprise a dielectric protrusion extending from the AOM, and an electrically conductive layer on the dielectric protrusion for coupling a respective transducer electrode to a respective signal contact.

Yet another aspect is directed to a method for making an acousto-optic device. The method may include forming an AOM comprising an acousto-optic medium and a plurality of transducer electrodes carried thereby, and forming an interface board comprising a dielectric layer and a plurality of signal contacts carried thereby. The method may comprise forming a plurality of connections coupling respective signal contacts with respective transducer electrodes. Each connection may comprise a dielectric protrusion extending from the AOM, and an electrically conductive layer on the dielectric protrusion for coupling a respective transducer electrode to a respective signal contact.

Another aspect is directed to a method for operating an acousto-optic device. The method may include providing an AOM comprising an acousto-optic medium and a plurality of transducer electrodes carried thereby, and an interface board comprising a dielectric layer and a plurality of signal contacts carried thereby. The method may include coupling the AOM and the interface board via a plurality of connections coupling respective signal contacts with respective transducer electrodes. Each connection may comprise a dielectric protrusion extending from the AOM, and an electrically conductive layer on the dielectric protrusion for coupling a respective transducer electrode to a respective signal contact.

DETAILED DESCRIPTION OF THE EMBODIMENTS

Figure 1:
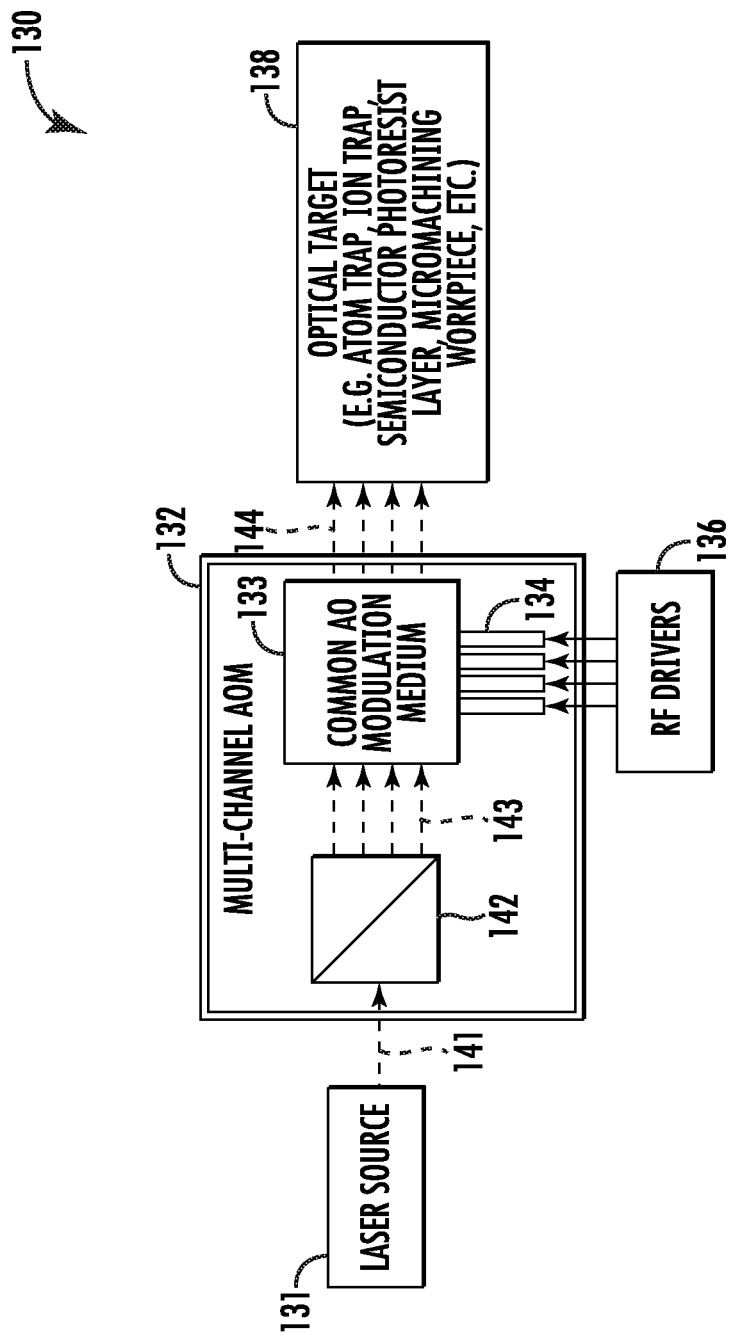
FIG. 1 is a schematic block diagram of a system including a multi-channel AOM in accordance with a first example embodiment, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

By way of background, excessive noise levels from laser sources in optical illumination systems may generate instabilities and errors. In particular, systems that manipulate the quantum states of particles, atoms and electrons, may require extreme stability.

Inter-channel acoustic crosstalk is a major source of data dependent variation in the modulated optical beam intensity. Electrical crosstalk between input channels can interfere coherently to produce variations in corresponding channel first order optical levels. In addition to coherent interactions leading to "ON" crosstalk effects on the optical beams, electrical crosstalk from other channels may induce a signal on a channel that is not being actively driven. This results in the production of a weak secondary "OFF" optical beam in the associated channel. Both the occurrence of "ON" and "OFF" channel crosstalk effects on the optical levels in the respective channels constitute a corrupting factor in many applications, such as, laser photomask generation and ion array based quantum computing.

In typical approaches, the connection of the electrical drive signals to the individual transducers may rely on the use of bond wires between an interface card terminating pad and associated transducer electrode. These bond wires may act as a source of magnetic field coupling between channels, primarily those whose feeds lie adjacent to one another. Additionally, electric field capacitive coupling between adjacent electrodes may produce undesirable crosstalk in localized channels as well.

Figure 2:
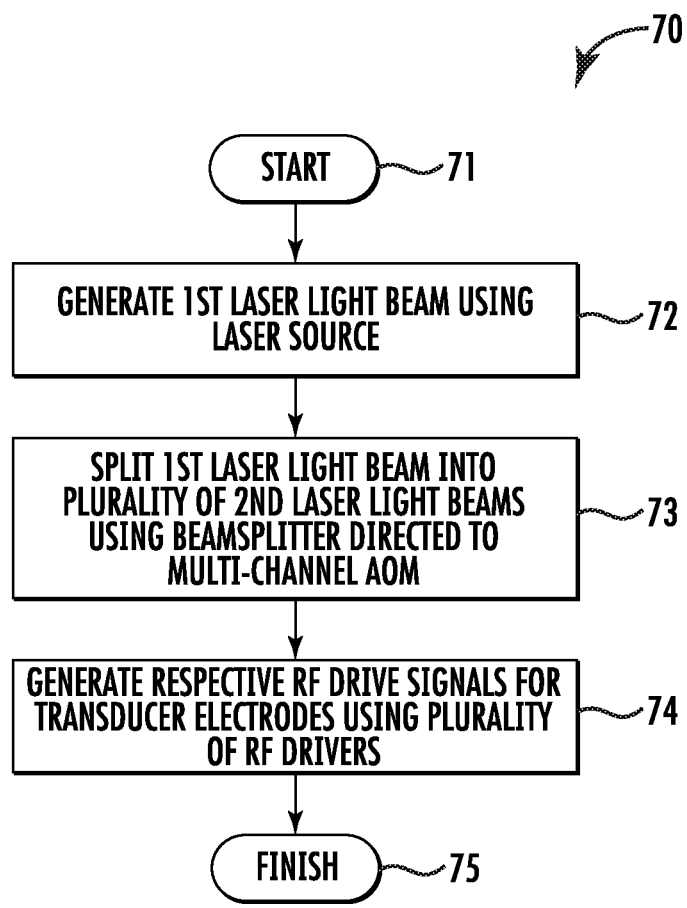
FIG. 2 is a flowchart illustrating method aspects associated with the system of FIG. 1.

Referring initially to FIG. 1 and a flowchart 70 of FIG. 2, a laser system 130, which provides multi-channel operation, and associated method aspects are now described. Beginning at Block 71, the multi-channel system 130 illustratively includes a laser source 131, which generates a first laser light beam 141, at Block 72. A diffractive/refractive beam splitter 142 divides the first laser light beam 141 into a plurality of second laser light beams 143, at Block 73, which in the illustrated example is four, although other numbers of beams (e.g., 8, 32, etc.) may be used depending upon the given application.

The second laser light beams 143 are received by a common acousto-optic modulation medium 133 of a multi-channel AOM 132. In other words, the acousto-optic medium 133 is common to all of the second laser light beams (i.e. the same acousto-optic medium is used to modulate each of the second laser light beams into modulated laser light beams 144). However, it should be noted that a phase-capable multi-channel AOM 132 need not be used, and that an amplitude modulation AOM may instead by used, for example.

The AOM 132 further includes multiple transducers, each comprising respective electrodes 134, for each of the second laser light beams 143 coupled to the common acousto-optic medium 133. The laser system 130 further illustratively includes a plurality of RF drivers 136, each configured to generate a requisite RF drive signals for their respective transducer electrodes 134, at Block 74, which illustratively concludes the method of FIG. 2 (Block 75).

Each RF driver 136 may be configured to drive a transducer comprising a single element or a transducer comprising an array of transducer elements 134 with different phases. By way of example, the transducer electrodes 134 may be implemented as metallizations on the piezoelectric AO medium 133, which are spaced apart 500 µm or less at their centers, and more particularly 450 µm or less. However, other dimensions may be used in different embodiments.

Accordingly, employing a phase modulation capable AOM or transducer structure in a multi-channel device configuration may provide advantages. More particularly, the effects of inter-channel acoustic crosstalk may be reduced since the integrated optical effect resulting from changes in the localized strain field due to adjacent transducer operation should be smaller than turning the adjacent field off altogether. This technique may be particularly appropriate when reduced "ON/OFF" contrast is acceptable, for example, mask generation involving photoresist. However, in addition to a photoresist layer of a semiconductor device, other optical targets 138 may also be used with the system 130, such as an ion trap(s), micromachining workpiece, etc.

Figure 3:
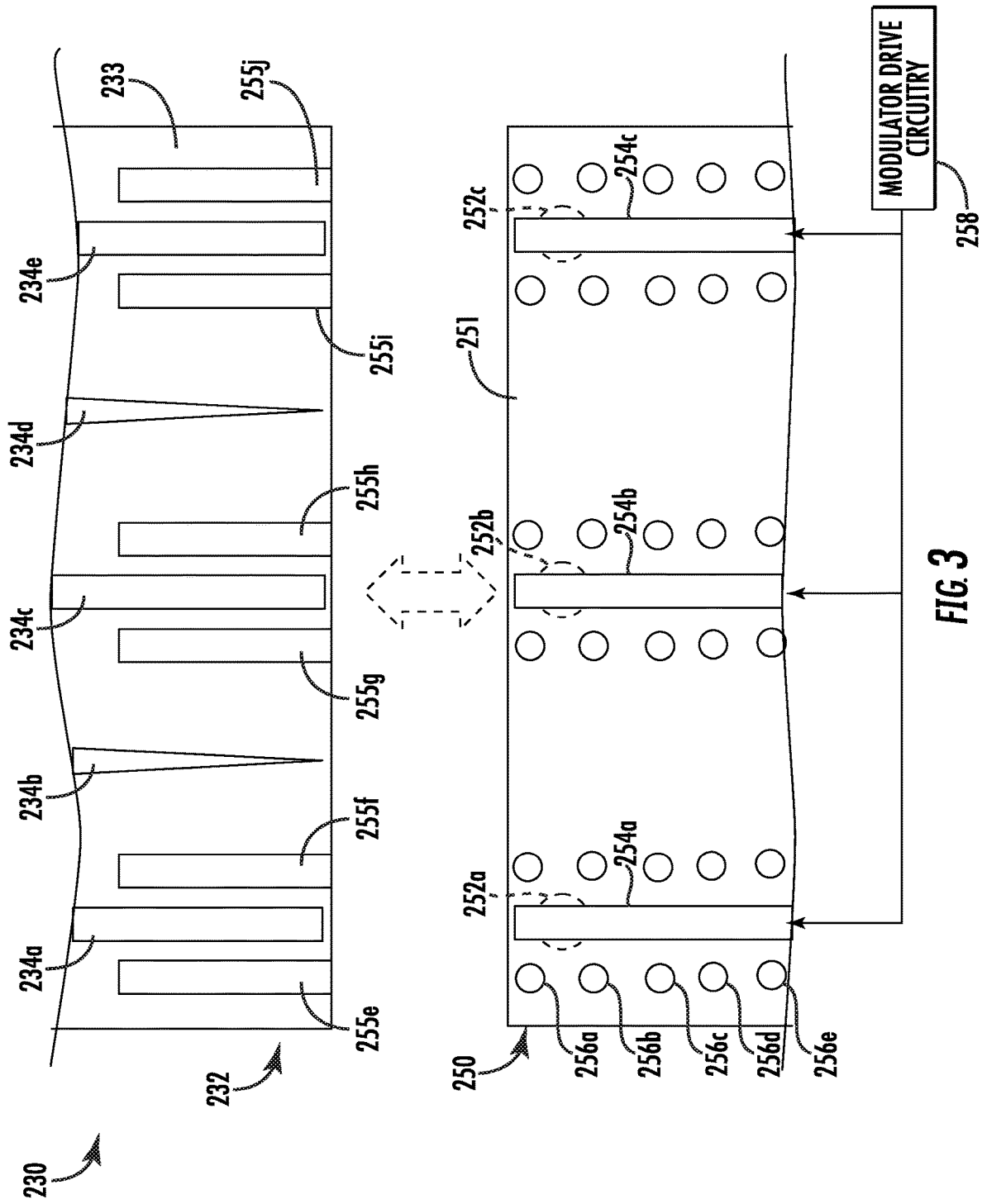
FIG. 3 is a schematic top plan view of an AOM and an interface card within a second example embodiment of the system, according to the present disclosure.
Figure 4:
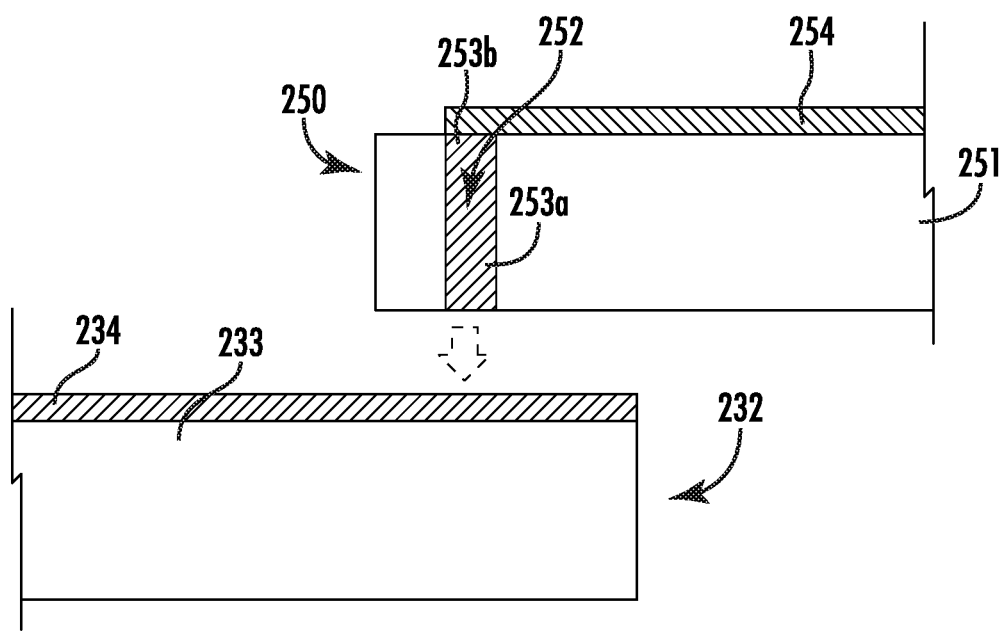
FIG. 4 is a schematic cross-sectional view of the AOM and the interface card of FIG. 3.
Figure 5:
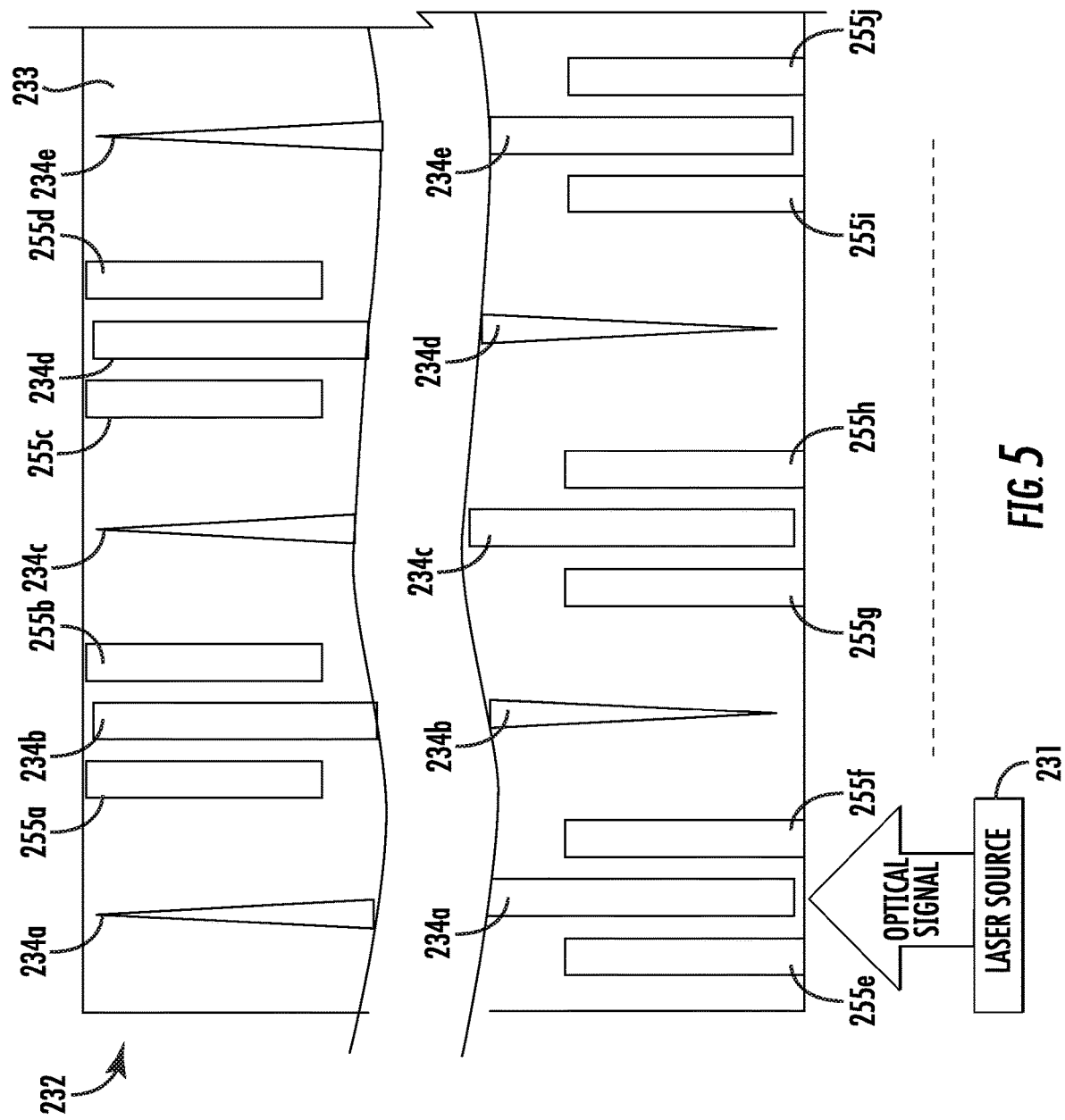
FIG. 5 is a schematic top plan view of the AOM of FIG. 3.

Referring now to FIGS. 3-5, another system 230 according to the present disclosure is now described. The system 230 illustratively comprises a laser source 231 (e.g. CW or pulsed laser source), and an AOM 232 coupled to the laser source. The AOM 232 may comprise a multi-channel AOM, such as in the embodiment of FIGS. 1-2, or a single channel AOM.

The AOM 232 illustratively includes an acousto-optic medium 233, and a plurality of transducer electrodes 234a-234e carried by the acousto-optic medium. The acousto-optic medium 233 may comprise at least one of fused silica and quartz, for example. In some embodiments, the system 230 may include an atom trap (FIG. 1) downstream from the AOM 232 so that the system defines a quantum computer.

The system 230 illustratively comprises an interface board 250 comprising a dielectric layer 251, and a plurality of vertically extending signal vias 252a-252c within the dielectric layer. As perhaps best seen in FIG. 4, each vertically extending signal via 252a-252c has a lower end 253a in contact with a respective transducer electrode 234. As will be appreciated, the lower end 253a of the plurality of vertically extending signal vias 252a-252c may be coupled to respective ones of the plurality of transducer electrodes 234a-234e using a board to board coupling technique, such as a conductive adhesive bonding method, or a pressure based contact method.

The interface board 250 illustratively comprises a plurality of laterally extending signal traces 254a-254c carried by the dielectric layer 251. Each laterally extending signal trace 254a-254c is in contact with an upper end 253b of a respective vertically extending signal via 252a-252c. In the illustrated embodiment, the plurality of laterally extending signal traces 254a-254c is carried on an upper surface of the dielectric layer 251, but in other embodiments, the plurality of laterally extending signal traces may extend within internal portions of the dielectric layer, or perhaps on the lower surface of the dielectric layer.

Also, the system 230 illustratively comprises modulator drive circuitry 258 coupled to the plurality of laterally extending signal traces 254a-25c. As will be appreciated, the modulator drive circuitry 258 is configured to generate a plurality of RF signals for respectively driving the plurality of transducer electrodes 234a-234e.

The AOM 232 includes a reference voltage contact pad (i.e. a ground voltage contact pad) 255a-255j carried by the acousto-optic medium 233 and adjacent to each of the plurality of transducer electrodes 234a-234e at their signal trace connection point. The interface board 250 illustratively comprises a plurality of vertically extending shield vias 256a-256e within the dielectric layer 251 coupled to the reference voltage contact pad 255a-255j and defining respective ground or reference voltage shields between adjacent laterally extending signal traces 254a-254c. As will be appreciated, the reference voltage contact pads 255a-255j may be coupled to an electrode reference voltage/ground at the bond interface of the AOM 232. As perhaps best seen in FIG. 3, each of the laterally extending signal traces 254a-254c is flanked on both sides with a row of vertically extending shield vias 256a-256e. Since these vertically extending shield vias 256a-256e are connected to the respective reference voltage contact pads 255a-255j, they provide for reduction in the inter-channel crosstalk.

The plurality of vertically extending shield vias 256a-256e also defines respective ground/reference voltage shields for distal ends of the plurality of transducer electrodes 234a-234e. More specifically, when the interface board 250 is coupled to a side of the AOM 232, the plurality of vertically extending shield vias 256a-256e overlays and is aligned with the reference voltage contact pads 255a-255j. The plurality of vertically extending shield vias 256a-256e is additionally coupled to a common signal generator ground reference voltage on the interface board 250. For example, the reference voltage on the interface board 250 may comprise a ground potential.

As perhaps best seen in FIG. 5, the plurality of transducer electrodes 234a-234e comprises a first set of transducer electrodes 234a, 234c, 234e and a second set of transducer electrodes 234b, 234d interdigitated with the first set of transducer electrodes. The plurality of vertically extending signal vias 252a-252c comprises first and second sets of vertically extending signal vias in contact with respective ones of the first and second sets of interdigitated transducer electrodes 234a-234e on opposite sides of the AOM 232.

In particular, as perhaps best seen in FIG. 4, the interface board 250 is coupled to the opposite sides of the AOM 232. For example, in some embodiments, the interface board 250 would comprise first and second interface boards for coupling to the opposite sides of the AOM 232.

Yet another aspect is directed to a method of making a system 230. The method comprises forming an interface board 250 comprising a dielectric layer 251, and a plurality of vertically extending signal vias 252a-252c within the dielectric layer. Each vertically extending signal via 252a-252c has a lower end 253a in contact with a respective transducer electrode 234a-234e at the top surface of a piezoelectric platelet bonded to an acousto-optic medium 233 of an AOM 232. The interface board 250 illustratively comprises a plurality of laterally extending signal traces 254a-254c carried by the dielectric layer 251. Each laterally extending signal trace 254a-254c is in contact with an upper end 253b of a respective vertically extending signal via 252a-252c. The method includes coupling the interface board 250 to the AOM 232.

Figure 6:
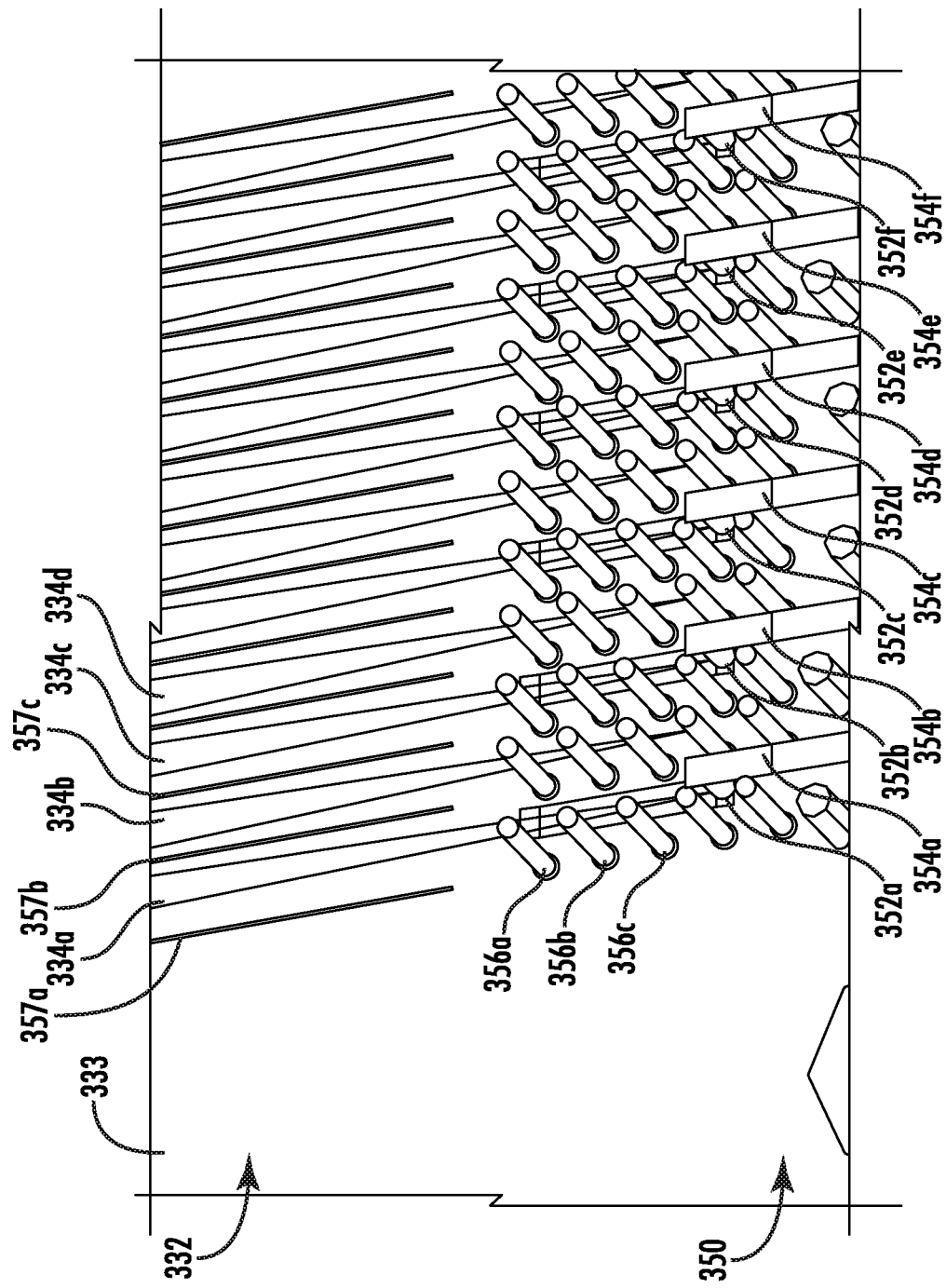
FIG. 6 is a schematic perspective view of a third example embodiment of the AOM and the interface card with the dielectric layer cutaway for clarity of explanation, according to the present disclosure.

Referring now additionally to FIG. 6, another embodiment of the AOM 332 and the interface board 350 is now described. In this embodiment of the AOM 332, and the interface board 350 containing the signal traces and associated shield vias, those elements already discussed above with respect to FIGS. 3-5 are incremented by 300 and most require no further discussion herein. This embodiment differs from the previous embodiment in that this AOM 332 illustratively includes an acousto-optic medium 333 having a plurality of trenches 357a-357c produced by removal of the high dielectric constant piezoelectric transducer platelet material between individual electrodes 334a-334c therein. Each trench 357a-357c is between adjacent ones of the plurality of transducer electrodes 334a-334c.

Figure 7:
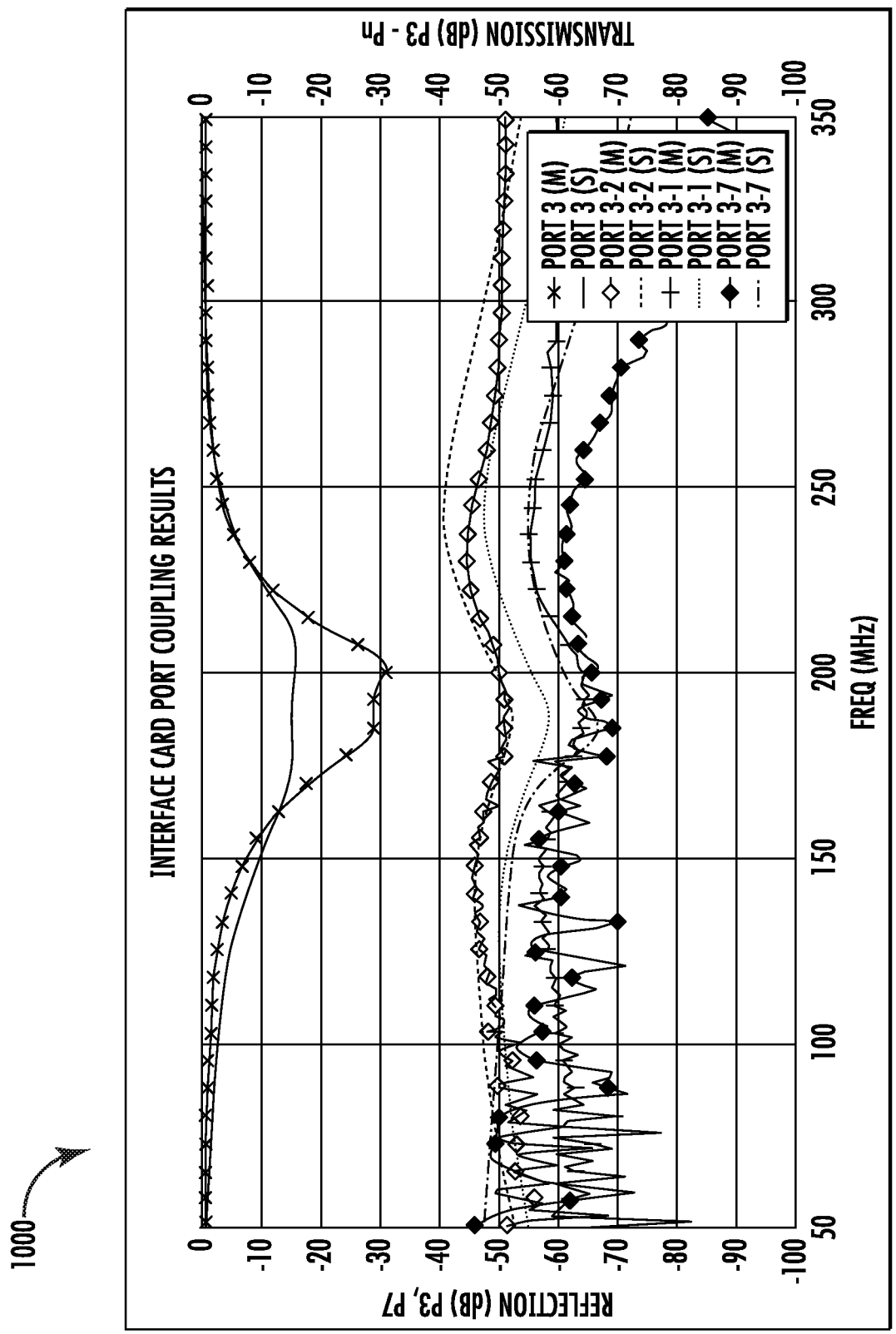
FIGS. 7 and 8 are diagrams of interface card port coupling in the AOM and the interface card, according to the present disclosure.
Figure 8:
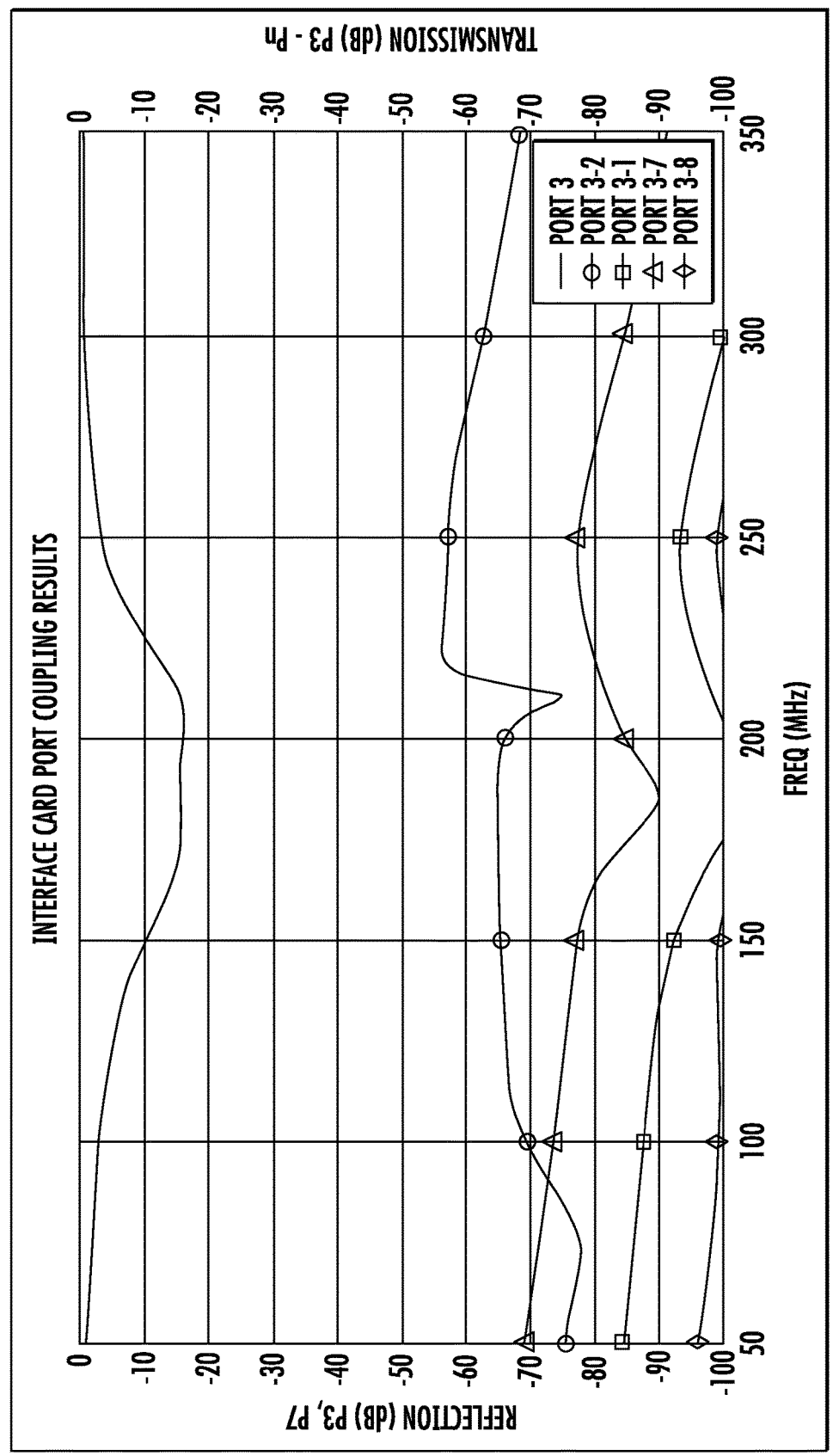

Referring now additionally to FIGS. 7-8, diagrams 1000, 1020 show a reduction in cross-talk between input channels in the system 230 disclosed herein. Applicant has determined that crosstalk between inputs originating on the same side of the interface card "electrical neighbors" may be a significant contributor to channel optical crosstalk. In addition, this source of crosstalk can severely limit the utility of using local channel active cancellation schemes to reduce optical crosstalk levels in an "off" channel resulting from acoustic spillover from nearest neighbor channels "optical neighbors". This technique relies on insertion of a low level "cancellation" signal within the primary acoustic channel having the correct amplitude and phase to reduce the integrated optical effect applied to the input beam in that channel. A high degree of electrical isolation may be required to minimize corruption of the low level cancellation input signal.

Applicant performed a detailed analysis of the input RF feed assembly associated with typical AOM construction to determine the principle factors contributing to the observed levels of electrical crosstalk. Diagram 1000 shows the measured and simulated model electrical port transmission coupling levels obtained for the typical monolithic multi-channel AOM.

Review of the model results indicates the principal contributor to adjacent electrical neighbor coupling comes from the bond wires connecting the input RF interface card terminating pads to the respective transducer electrodes. The levels of crosstalk produced by this source of coupling between input channels can interfere coherently with other "ON" channels to produce variations in the optical illumination levels presented to the individual ions. Depending on the relative drive signal phase offset, this can result in a variation in channel beam intensity of greater than +/−0.6% for an RF coupling level of −50 dB between adjacent channels. With many channels driven at the same time, the variation in intensity observed within any one channel may readily exceed +/−1.0%.

In addition to coherent interactions leading to "ON" crosstalk effects on the optical beams, electrical crosstalk from other channels and acoustic diffraction "spillover" from adjacent channels, may induce a signal on a channel which is not being actively driven. This results in the production of a weak secondary "OFF" optical beam in the associated channel. In ion trap array qubit addressing applications, this low level coherent optical field may appear as a low level addressable Raman beam. The presence of a corrupting optical field at an un-addressed ion location may directly contribute to internal ionic state errors and decoherence of the ion array, leading to a measured reduction in gate fidelity. Both the occurrence of "ON" and "OFF" channel crosstalk effects on the optical levels in the respective channels constitute a corrupting factor in many applications, such as laser photomask generation and ion array based quantum computing.

As shown in diagram 1020, the results obtained indicate a carefully structured interface (e.g., the above system 230), which eliminates the use of conventional bond wire connections while incorporating several additional modifications to both the interface card and the resonant platelet structure, may significantly reduce electrical coupling between ports.

In summary, the system 230 eliminates conventional bond wire connections between the transducer electrode and corresponding trace pad. The system 230 may provide a direct connection of the trace input termination pad directly to the transducer electrode. By using the shield via structure connecting to the interface board 250 ground to the transducer ground plane adjacent to the signal pad connection point, the system 230 may reduce channel crosstalk. Moreover, the system 230 removes high dielectric transducer "trench" region between adjacent electrodes to reduce inter-electrode coupling capacitance.

Referring now to FIGS. 9A-9B and 10-11, another acousto-optic system 430 according to the present disclosure is now described. It should be appreciated that the teachings of the above disclosed acousto-optic systems 130, 230, 330 could be applied to this acousto-optic system 430.

The acousto-optic system 430 illustratively comprises a laser source (e.g. laser source 131 (FIG. 1), 231 (FIG. 5)), and an AOM 432 coupled to the laser source. The AOM 432 illustratively includes an acousto-optic medium 433, and a plurality of transducer electrodes 434a-434f, 434g-434k carried thereby. For example, the acousto-optic medium 433 may comprise at least one of fused silica and quartz. In some embodiments, the acousto-optic system 430 may comprise an atom trap downstream from the AOM 432 so that the system defines a quantum computer.

Figure 10:
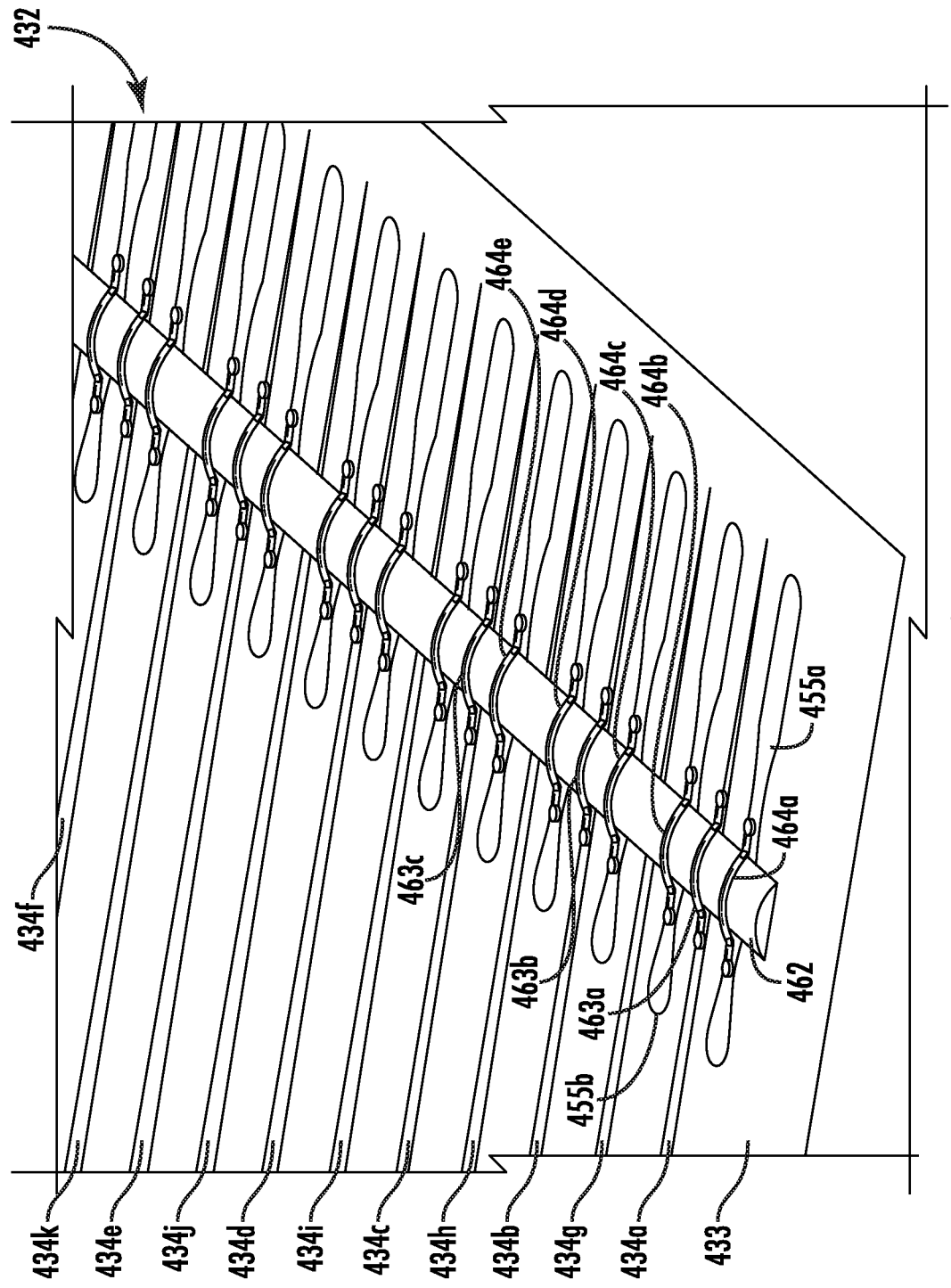
FIG. 10 is a schematic perspective view of the AOM from the system of FIGS. 9A and 9B.

As perhaps best seen in FIG. 10, the plurality of transducer electrodes 434a-434f, 434g-434k comprises a first set of transducer electrodes 434a-434f, and a second set of transducer electrodes 434g-434k opposing the first set of transducer electrodes. This interdigitated arrangement is similar to that of the embodiment of FIGS. 3-5

The acousto-optic system 430 illustratively comprises an interface board 450. The interface board 450 illustratively includes a dielectric layer 451 and a plurality of signal contacts 460a-460d (e.g., electrically conductive material, copper, gold, or silver) carried thereby on an outer surface. The acousto-optic system 430 also comprises a plurality of connections 461 coupling respective signal contacts 460a-460d with respective transducer electrodes 434a-434f, 434g-434k (i.e. illustratively the first set of transducer electrodes 434a-434f). Although not illustrated for the sake of drawing clarity, the interface board 450 may comprise first and second sides for coupling to the first set of transducer electrodes 434a-434f, and the second set of transducer electrodes 434g-434k of the opposite side of the AOM 432.

Each connection 461 illustratively includes a dielectric protrusion 462 extending from the AOM 432, and an electrically conductive layer 463 (e.g., electrically conductive material, copper, gold, or silver) on the dielectric protrusion for coupling a respective transducer electrode 434a-434f, 434g-434k to a respective signal contact 460a-460d.

In the illustrated embodiment and as perhaps best seen in FIG. 10, the respective dielectric protrusions 462 for the plurality of connections 461 are contiguous with one another and define an elongate strip. In other embodiments, each connection 461 may include an individual dielectric protrusion 462 spaced apart from adjacent ones.

Figure 11A:
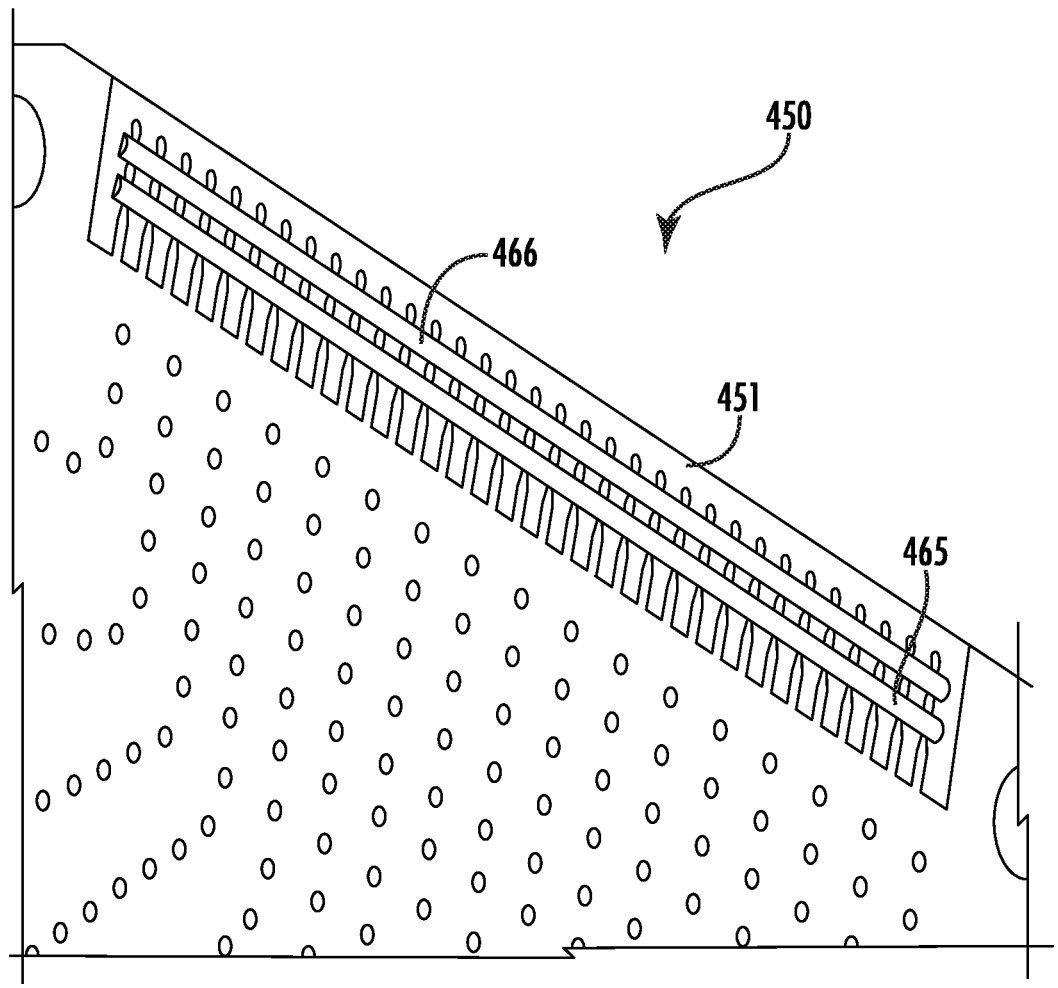
FIG. 11A is a schematic perspective view of the interface board from the system of FIGS. 9A and 9B.

As seen in FIG. 11A, each connection 461 illustratively comprises a pair of spaced apart alignment protrusions 465, 466 extending from the interface board 450 with the dielectric protrusion 462 to be aligned therebetween. The pair of spaced apart alignment protrusions 465, 466 may each comprise a dielectric material. When the interface board 450 and the AOM 432 are in proper lateral alignment, the dielectric protrusion 462 is between the pair of spaced apart alignment protrusions 465, 466, such as depicted in FIGS. 9A and 9B.

The dielectric protrusion 462 and the pair of spaced apart alignment protrusions 465, 466 may each have a width of 10 mils (0.254 mm)±20%. The dielectric protrusion 462 and the pair of spaced apart alignment protrusions 465, 466 may each be formed using an aerosol jet printing process. As will be appreciated, the aerosol jet printing process has a 10 μm resolution, is compatible with commercially available polymers, and is capable of printing on uneven surfaces. Also, the dielectric protrusion 462 and the pair of spaced apart alignment protrusions 465, 466 may each comprise a low-durometer dielectric material. Of course, other methods for depositing the dielectric material can be used, such as an inkjet printing process, or a deposition process.

Figure 9A:
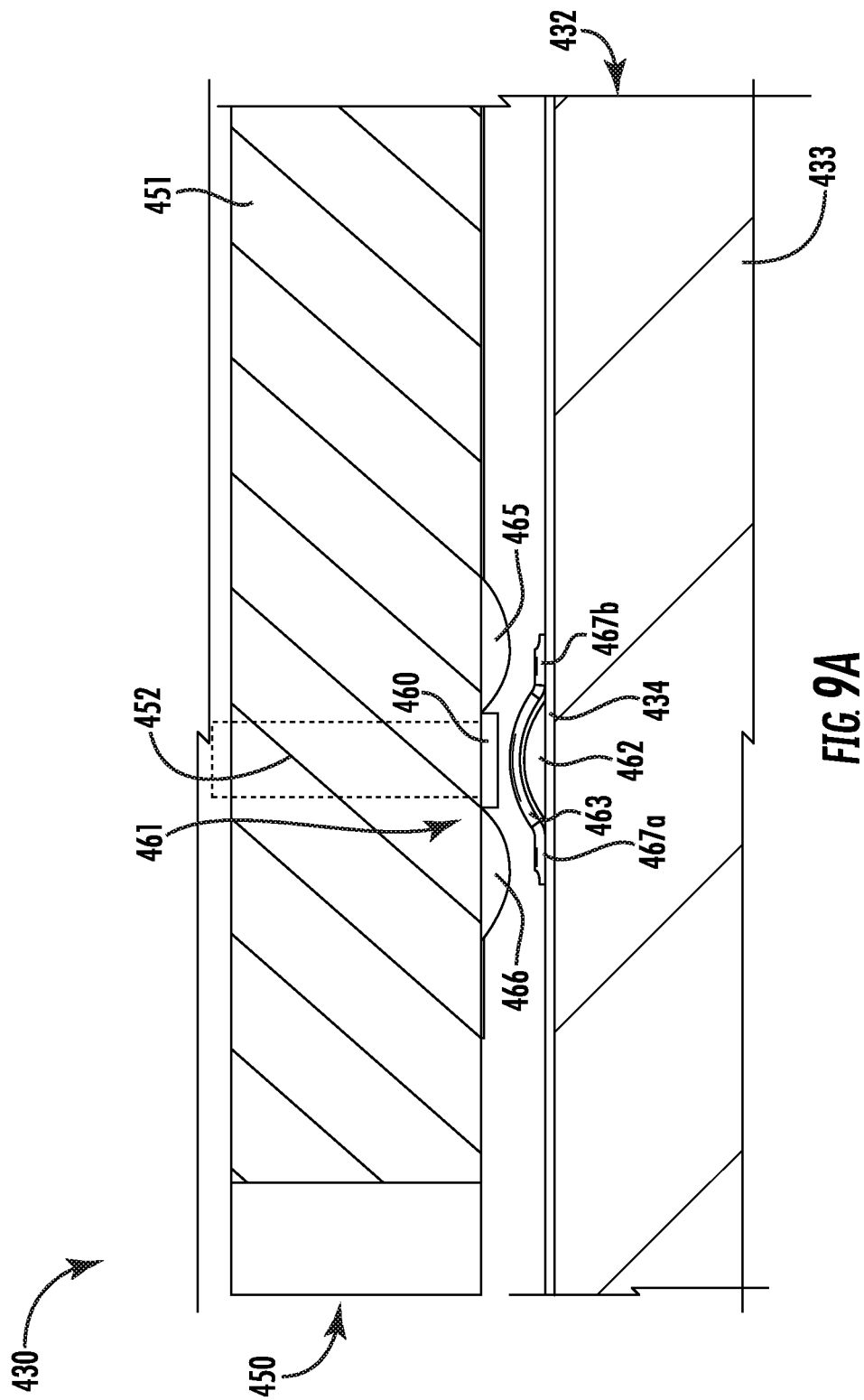
FIGS. 9A and 9B are schematic cross-sectional views of the AOM and the interface card, uncoupled and coupled, respectively, within a fourth example embodiment of the system, according to the present disclosure.
Figure 9B:
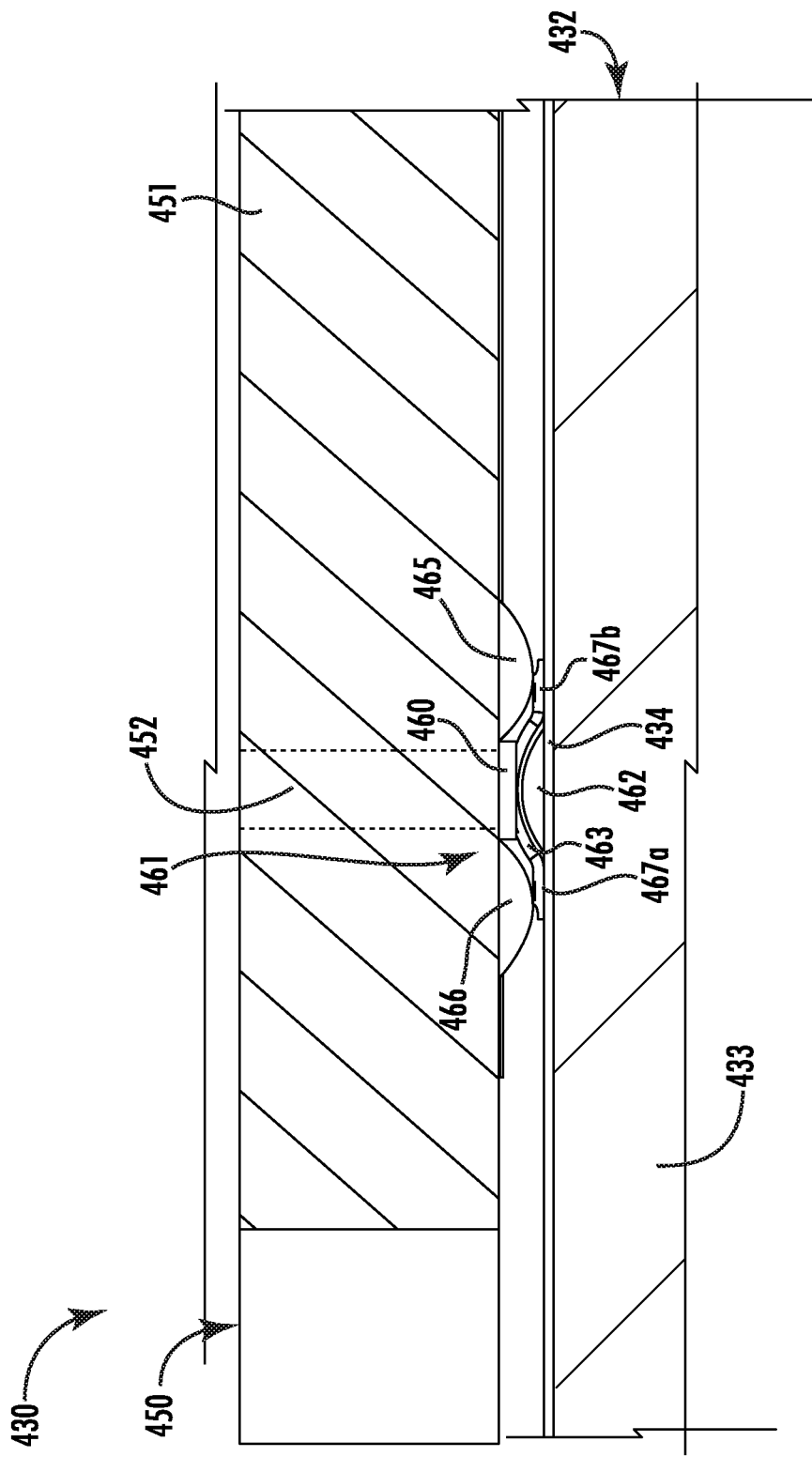

As perhaps best seen in FIGS. 9A-10, each transducer electrode 434a-434f, 434g-434k extends beneath a respective dielectric protrusion 462 and extends laterally free of the respective dielectric protrusion. Each electrically conductive layer 463 comprises an electrically conductive strap having opposing ends 467a-467b coupled to the (i.e. the laterally free and clear portions of) respective transducer electrode 434a-434f, 434g-434k. Helpfully, the electrically conductive straps may be formed using typical bond wire techniques. The opposing ends 467a-467b are coupled to the respective transducer electrode 434a-434f, 434g-434k via a conductive adhesive, for example.

In some embodiments, the acousto-optic system 430 also includes modulator drive circuitry (258: FIG. 3) coupled to the plurality of signal contacts 460a-460d. As perhaps best see in FIGS. 9A-9B, the interface board 450 illustratively includes a plurality of vertically extending signal vias 452 (e.g., electrically conductive material, copper, gold, or silver) coupled respectively to the plurality of signal contacts 460a-460d and carrying a signal from the modulator drive circuitry.

Figure 11B:
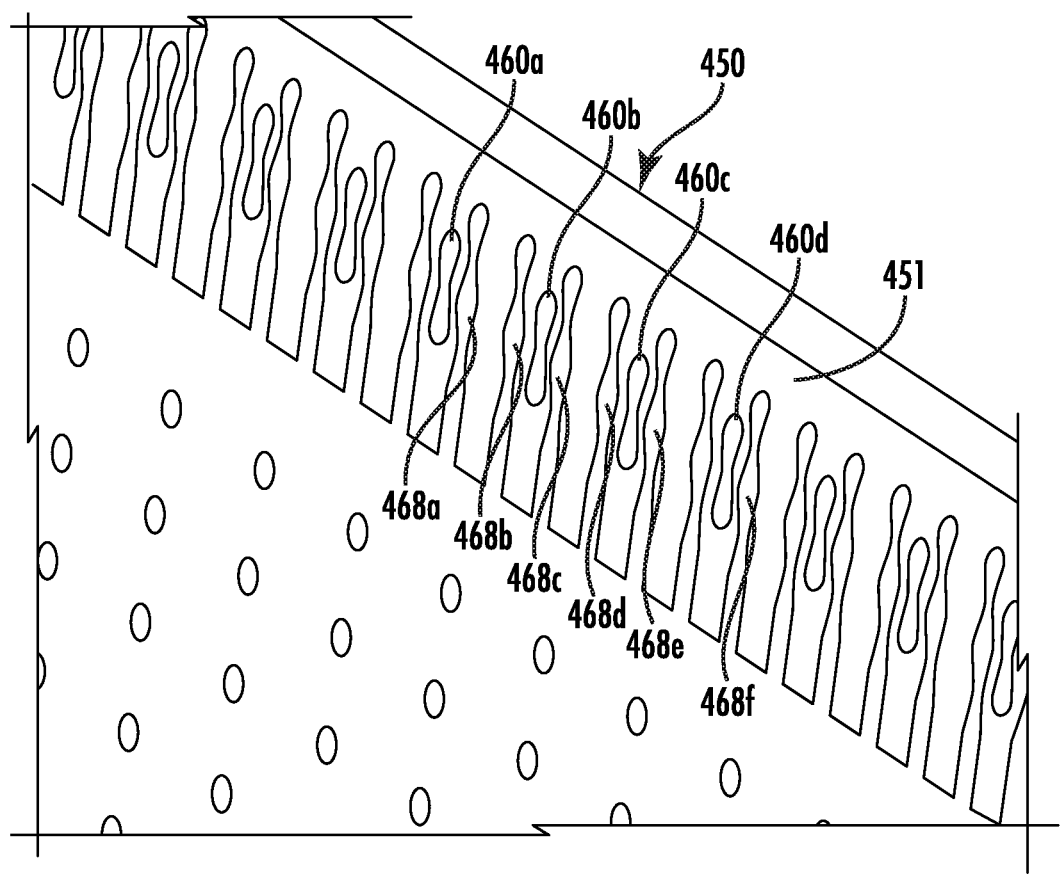
FIG. 11B is a schematic perspective view of the interface board from the system of FIGS. 9A and 9B with the pair of spaced apart alignment protrusions cutaway for clarity of explanation.
Figure 12:
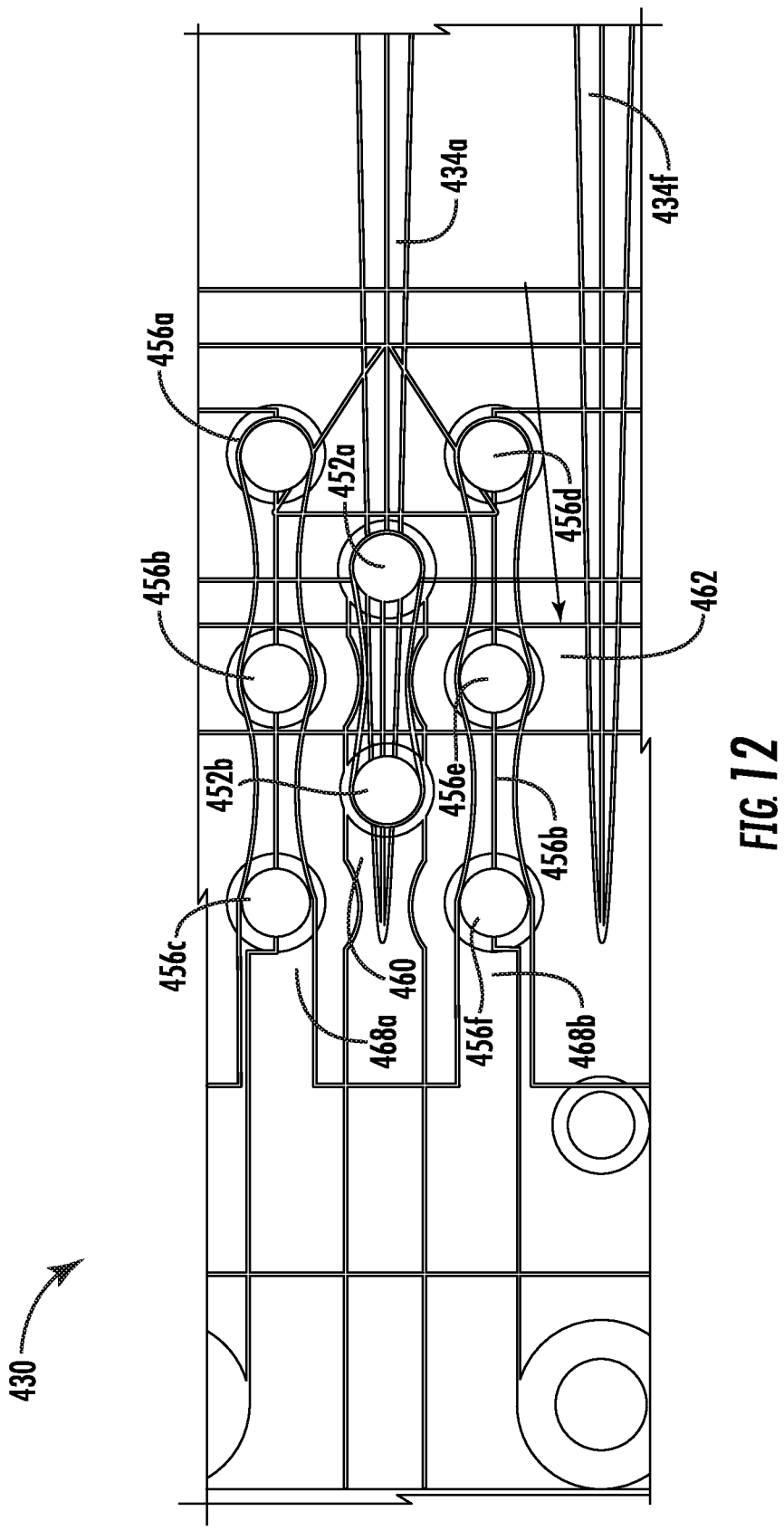
FIG. 12 is a schematic to plan view of the coupled AOM and interface board from the system of FIGS. 9A and 9B.

As perhaps best seen in FIGS. 11B and 12, the interface board 450 illustratively comprises a plurality of reference voltage shield vias 456a-456f (e.g., electrically conductive material, copper, gold, or silver) and respective reference voltage traces 468a-468f coupled thereto. As will be appreciated, the reference voltage may comprise a ground potential of one or both of the interface board 450 and the AOM 432.

Yet another aspect is directed to a method for making an acousto-optic device 430. The method includes forming an AOM 432 comprising an acousto-optic medium 433 and a plurality of transducer electrodes 434a-434f, 434g-434k carried thereby. The method includes forming an interface board 450 comprising a dielectric layer 451 and a plurality of signal contacts 460a-460d carried thereby. The method comprises forming a plurality of connections 461 coupling respective signal contacts 460a-460d with respective transducer electrodes 434a-434f, 434g-434k. Each connection 461 includes a dielectric protrusion 462 extending from the AOM 432, and an electrically conductive layer 463 on the dielectric protrusion for coupling a respective transducer electrode 434a-434f, 434g-434k to a respective signal contact 460a-460d.

Another aspect is directed to a method for operating an acousto-optic device 430. The method includes providing an AOM 432 comprising an acousto-optic medium 433 and a plurality of transducer electrodes 434a-434f, 434g-434k carried thereby, and an interface board 450 comprising a dielectric layer 451 and a plurality of signal contacts 460a-460d carried thereby. The method includes coupling the AOM 432 and the interface board 450 via a plurality of connections 461 coupling respective signal contacts 460a-460d with respective transducer electrodes 434a-434f, 434g-434k. Each connection 461 comprises a dielectric protrusion 462 extending from the AOM 432, and an electrically conductive layer 463 on the dielectric protrusion for coupling a respective transducer electrode 434a-434f, 434g-434k to a respective signal contact 460a-460d.

Advantageously, the acousto-optic system 430 may use precise and commercially available techniques for manufacturing. In particular, additive printed dielectric technology is used for the dielectric protrusion 462 and the pair of spaced apart alignment protrusions 465, 466, and typical bond wire techniques are used to form the electrically conductive straps. As with the above described embodiments of acousto-optic system 130, 230, 330, the acousto-optic system 430 also eliminates the long bond wire couplings of typical approaches, which similarly reduces the magnetic field coupling and crosstalk issues. The dielectric protrusion 462 and the pair of spaced apart alignment protrusions 465, 466 may allow for easy alignment of the interface board 450 and the AOM 432. This acousto-optic system 430 also may permit secure seating of the interface board 450 and the AOM 432 using a locking bracket after final alignment, and also supports a three point "quasi-transmission line" shielded contact structure.

Other features relating to optics are disclosed in co-pending applications, titled "Multi-Channel Laser System Including An AOM With Beam Polarization Switching And Related Methods," U.S. patent application Ser. No. 16/458,457, and "AOM SYSTEM WITH INTERFACE BOARD AND SIGNAL VIAS AND RELATED METHODS", which is incorporated herein by reference in its entirety.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An acousto-optic system comprising:
a laser source;
an acousto-optic modulator (AOM) coupled to said laser source and comprising an acousto-optic medium and a plurality of transducer electrodes carried by the acousto-optic medium; and
an interface board comprising a dielectric layer and a plurality of signal contacts carried by the dielectric layer; and
a plurality of connections coupling respective signal contacts with respective transducer electrodes, each connection comprising
a dielectric protrusion extending from said AOM, and
an electrically conductive layer on said dielectric protrusion for coupling a respective transducer electrode to a respective signal contact.

2. The acousto-optic system of claim 1 wherein each connection comprises a pair of spaced apart alignment protrusions extending from said interface board with said dielectric protrusion therebetween.

3. The acousto-optic system of claim 1 wherein each transducer electrode extends beneath a respective dielectric protrusion.

4. The acousto-optic system of claim 1 wherein each electrically conductive layer comprises an electrically conductive strap having opposing ends coupled to the respective transducer electrode.

5. The acousto-optic system of claim 1 wherein the respective dielectric protrusions for the plurality of connections are contiguous with one another and define an elongate strip.

6. The acousto-optic system of claim 1 wherein said interface board comprises a plurality of vertically extending signal vias coupled respectively to said plurality of signal contacts.

7. The acousto-optic system of claim 1 wherein said interface board comprises a plurality of reference voltage shield vias and respective reference voltage traces coupled thereto.

8. The acousto-optic system of claim 1 comprising modulator drive circuitry coupled to said plurality of signal contacts.

9. The acousto-optic system of claim 1 wherein said acousto-optic medium comprises at least one of fused silica and quartz.

10. The acousto-optic system of claim 1 comprising an atom trap downstream from said AOM so that the system defines a quantum computer.

11. An acousto-optic device comprising:
an acousto-optic modulator (AOM) comprising an acousto-optic medium and a plurality of transducer electrodes carried by the acousto-optic medium; and
an interface board comprising a dielectric layer and a plurality of signal contacts carried by the dielectric layer; and
a plurality of connections coupling respective signal contacts with respective transducer electrodes, each connection comprising
a dielectric protrusion extending from said AOM, and
an electrically conductive layer on said dielectric protrusion for coupling a respective transducer electrode to a respective signal contact.

12. The acousto-optic device of claim 11 wherein each connection comprises a pair of spaced apart alignment protrusions extending from said interface board with said dielectric protrusion therebetween.

13. The acousto-optic device of claim 11 wherein each transducer electrode extends beneath a respective dielectric protrusion.

14. The acousto-optic device of claim 11 wherein each electrically conductive layer comprises an electrically conductive strap having opposing ends coupled to the respective transducer electrode.

15. The acousto-optic device of claim 11 wherein the respective dielectric protrusions for the plurality of connections are contiguous with one another and define an elongate strip.

16. The acousto-optic device of claim 11 wherein said interface board comprises a plurality of vertically extending signal vias coupled respectively to said plurality of signal contacts.

17. The acousto-optic device of claim 11 wherein said interface board comprises a plurality of reference voltage shield vias and respective reference voltage traces coupled thereto.

* * * * *